United States Patent [19]

Kira

[11] Patent Number: 4,605,301

[45] Date of Patent: Aug. 12, 1986

[54] EXPOSURE METHOD OF SEMICONDUCTOR WAFER BY MERCURY-VAPOR LAMP

[75] Inventor: Takehiro Kira, Kobe, Japan

[73] Assignee: Ushio Denki Kabushiki Kaisha, Tokyo, Japan

[21] Appl. No.: 705,646

[22] Filed: Feb. 26, 1985

[30] Foreign Application Priority Data

Jul. 7, 1984 [JP] Japan ................................ 59-139774
Jul. 7, 1984 [JP] Japan ................................ 59-139775

[51] Int. Cl.$^4$ ........................ G03B 27/72; G05F 1/00
[52] U.S. Cl. ...................................... 355/69; 355/77; 315/291; 315/302; 315/308
[58] Field of Search .................... 355/67, 69, 71, 77; 315/151, 291, 307, 302, 308

[56] References Cited

U.S. PATENT DOCUMENTS 4,024,428  5/1977  Bachur et al. ................... 355/69 X Primary Examiner—L. T. Hix
Assistant Examiner—Della Rutledge
Attorney, Agent, or Firm—Ziems, Walter & Shannon

[57] ABSTRACT

Through a pattern mask, small sections of a semiconductor wafer are exposed successively to light radiated from a mercury-vapor lamp in high-level steps, during each of which the power consumption and discharge current of the mercury-vapor lamp are at a high level, by continuously lighting the mercury-vapor lamp and repeatedly alternating each of the high-level steps and a low-level step during which the power consumption and discharge current of the mercury-vapor lamp are at a low level. The alternation of the high-level step and low-level step is effected while controlling the magnitude of each of the overshoot and undershoot in the waveform of the discharge current for the mercury-vapor lamp below 10%. The exposure method of this invention is effective in avoiding or minimizing the wearing of electrodes of a mercury-vapor lamp. Thus, the mercury-vapor lamp can enjoy long service life while permitting stable exposure over a long period of time.

6 Claims, 7 Drawing Figures

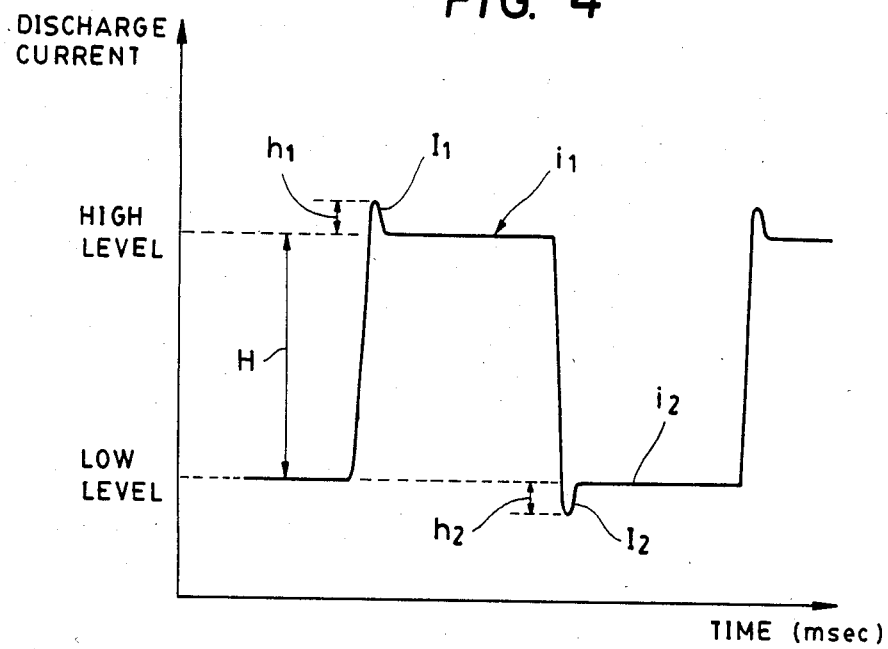
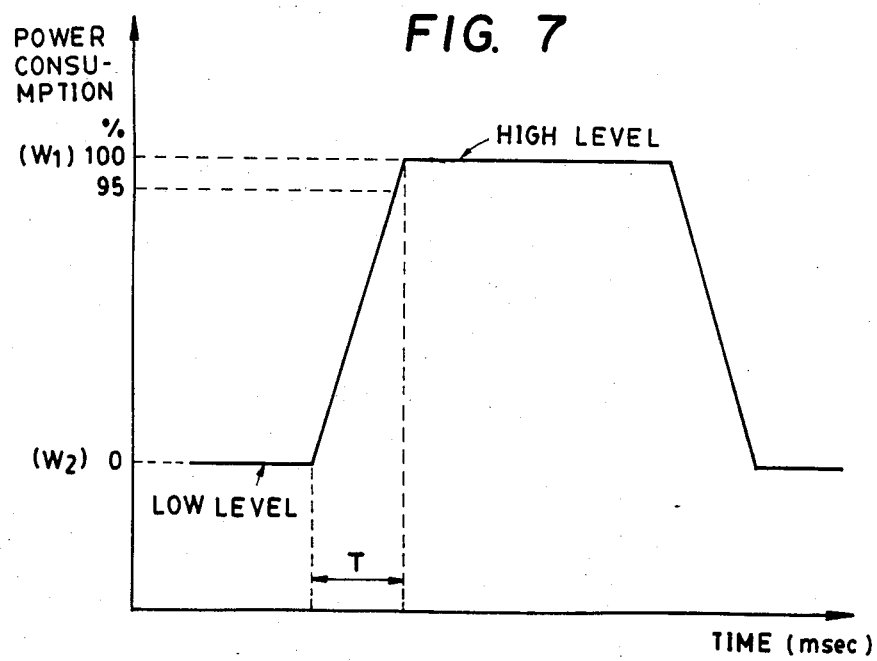

EXPOSURE METHOD OF SEMICONDUCTOR WAFER BY MERCURY-VAPOR LAMP

BACKGROUND OF THE INVENTION (1.) Field of the Invention:

This invention relates to an exposure method of a semiconductor wafer by a mercury-vapor lamp.

(2.) Description of the Prior Art:

Upon fabrication of a semiconductor device such as an integrated circuit, large-scale integrated circuit, super large-scale integrated circuit or the like, a photofabrication process is carried out. For example, in order to remove portions of a silicon oxide film formed on a surface of a substrate, which is for example a silicon wafer, a photofabrication process is carried out in accordance with an image pattern such as a circuit pattern. This photofabrication process includes such steps that a photoresist film is formed over the silicon oxide film on the silicon substrate and the photoresist film is then exposed to ultraviolet rays through a photomask having a pattern image. After exposure, the photoresist film is developed and the silicon oxide film is then subjected to an etching treatment. Thereafter, a circuit-forming treatment such as diffusion, ion implantation or the like is applied to the silicon substrate through the thus-etched silicon oxide film.

A semiconductor wafer is generally circular with its surface area supposed to be divided into minute square sections in rows and columns. These minute sections will each be cut afterwards to form chips which will be semiconductor devices respectively. A sheet of semiconductor wafer is generally 3 inches, 5 inches or 6 inches across. The sizes of such semiconductor wafers tend to increase coupled with progresses in their fabrication technology.

A high-output mercury-vapor lamp is indispensable in order to expose the entire surface of a semiconductor wafer simultaneously so that all the minute sections, which will individually be formed into chips, are printed at once. Use of such a high-output mercury-vapor lamp is however accompanied by such problems that it renders an exposure system in which the lamp is assembled large and a considerably high degree of technique is required for the uniformity of illuminance on the surface of the semiconductor wafer. Consequently, it is very difficult to meet the tendency of enlargement of semiconductor wafers practically.

With the foregoing in view, it has recently been proposed to expose minute sections, which are arranged in rows and columns on a semiconductor wafer, one after another successively so that pattern images are printed successively and respectively on the minute sections. In such a stepwise exposure method, it is carried out to expose an area equivalent to only one of the minute sections in each exposure operation. Therefore, the stepwise exposure method permits the use of a low-output mercury-lamp, thereby bringing about such substantial advantages that an exposure system employed would have been reduced in size and the illuminance can be readily made uniform on the surface of each semiconductor wafer because the area of each exposure is small. As a result, a pattern image can be printed with a high degree of accuracy.

A mercury-vapor lamp cannot however be repeatedly turned on and off in a short cycle because the enclosed mercury vapor undergoes condensation while the lamp is turned off. It is therefore advantageous to cause a mercury-vapor lamp to light repeatedly and alternately at a low power consumption level and at a high power consumption level while maintaining the mercury-vapor lamp in a continuously-lit state, to expose a minute section of a semiconductor wafer, which minute section has assumed an exposure position, to the light from the mercury-vapor lamp when the mercury-vapor lamp is lit at the high power consumption level, and when the mercury-vapor lamp is lit at the low power consumption level, to shift the semiconductor wafer stepwise so that another minute section of the semiconductor wafer, which another minute section is to be subjected to next exposure, is allowed to assume the exposure position, while the light from the mercury-vapor lamp is cut off by means of a shutter. The above manner can provide a required level of light quantity at the high power consumption level and at the same time, keeps the mercury-vapor lamp in its lit state at the low power consumption level while avoiding wasting of electric power.

In such a stepwise exposure method, the light of the mercury-vapor lamp is not utilized while the shutter is closed, resulting in such drawbacks that lots of electricity are still wasted and the shutter is susceptible to considerable damages due to its exposure to the high-energy light. The shutter is required to operate quick, because if its opening or closing motion should be slow, non-uniform exposure of a semiconductor wafer due to such a slow opening or closing motion of the shutter becomes a problem. In order to meet this requirement, it is indispensable that the shutter has a lightweight. However, a light-weight shutter will inevitably result in poor heat resistance. As a result, such a lightweight shutter tends to undergo deformation due to heat which is built up while shielding the light and hence to develop a malfunction which impairs its smooth opening and closing operation.

With the foregoing in view, it may be contemplated to light, during each closure period of the shutter, the mercury-vapor lamp with a power consumption smaller than its power consumption during the exposure time, i.e., while the shutter is kept open.

Such an exposure method has however been found to involve a new problem. Namely, when the power consumption of the mercury-vapor lamp is varied at a short time interval to conduct the exposure treatment of the semiconductor wafer at a high speed while keeping the mercury-vapor lamp lit continuously, its electrodes are subjected to severe wearing and the quantity of light radiated from the mercury-vapor lamp is thus gradually reduced along the passage of the lit time of the mercury-vapor lamp. Moreover, the service life of the mercury-vapor lamp becomes shorter. As a result, it is not possible to carry out stable exposure continuously at the initial degree of exposure over a long period of time.

SUMMARY OF THE INVENTION

With the foregoing in view, the present invention has as its object the provision of a method for exposing a semiconductor wafer by a mercury-vapor lamp, in which method the wearing of the electrodes of the mercury-vapor lamp is avoided and an exposure, which is repeated at a short time interval, can be stably conducted over a long period of time while enjoying prolonged service life of the mercury-vapor lamp, in other words, a low fabrication cost.

In one aspect of this invention, there is thus provided a method for exposing, through a pattern mask, small sections of a semiconductor wafer successively to light radiated from a mercury-vapor lamp in high-level steps, during each of which the power consumption of the mercury-vapor lamp is at a high level, by continuously lighting the mercury-vapor lamp and repeatedly alternating each of the high-level steps and a low-level step during which the power consumption of the mercury-vapor lamp is at a low level, in which method the alternation of the high-level step and low-level step is effected while controlling the magnitude of each of the overshoot and undershoot in the waveform of the discharge current for the mercury-vapor lamp below 10%.

In another aspect of this invention, the switch-over from each low-level step to its subsequent high-level step is carried out in such a way that the power consumption of the mercury-vapor lamp reaches 95% of the power consumption in the high-level step within a period ranging from 1 msec. to 30 msec.

In a further aspect of this invention, the alternation of the high-level step and low-level step is effected while controlling the magnitude of each of the overshoot and undershoot in the waveform of the discharge current for the mercury-vapor lamp below 10% and the switch-over from each low-level step to its subsequent high-level step is carried out in such a way that the power consumption of the mercury-vapor lamp reaches 95% of the power consumption in the high-level step within a period ranging from 1msec. to 30 msec.

The exposure method of this invention is effective in avoiding or minimizing the wearing of electrodes of a mercury-vapor lamp. Thus, the mercury-vapor lamp can enjoy long service life while permitting stable exposure over a long period of time.

The above and other objects, features and advantages of the present invention will become apparent from the following description and the appended claims, taken in conjunction with the accompanying drawings.

BRIEF DESCRIPTION OF THE DRAWINGS

In the accompanying drawings:

FIG. 4 is a diagram showing overshoot and undershoot in the waveform of discharge current for a mercury-vapor lamp;

FIG. 7 is a diagram showing the rising manner of the power consumption of the mercury-vapor lamp from a low-level step to its subsequent high-level step.

DETAILED DESCRIPTION OF THE INVENTION AND PREFERRED EMBODIMENTS

The invention will hereinafter be described in detail with reference to the accompanying drawings.

Figure 1:
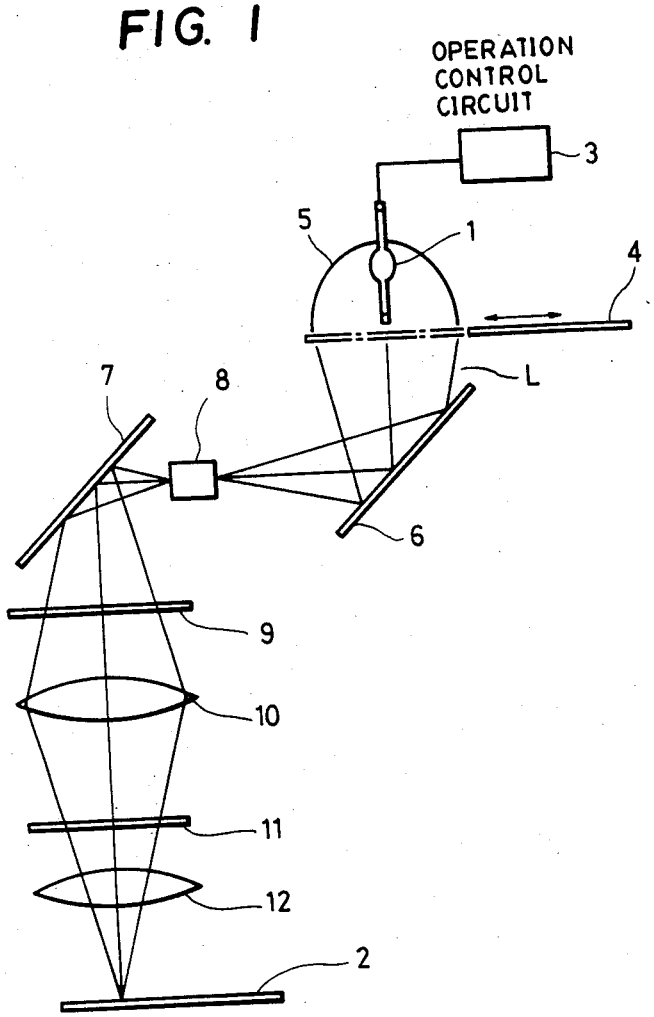
FIG. 1 is a simplified schematic illustration of one example of an exposure system.

For printing a pattern image by ultraviolet rays in such a manner as mentioned above, there is employed an exposure system having such an optical light-focusing and projection system as depicted for example in FIG. 1. In FIG. 1, numeral 1 indicates a short-arc mercury-vapor lamp which is an exposing light source. This short-arc mercury-vapor lamp 1 is installed at such a position that its arc is located on the focal point of a light-focusing mirror 5. Light L, which has been given off from the short-arc mercury-vapor lamp 1, is focused by the light-focusing mirror 5, and is then projected onto a photomask 11 bearing a circuit pattern image thereon by way of a first plane mirror 6, integrator 8, second plane mirror 7 and condenser lens 10. Light, which has transmitted through the photomask 11, is projected via a reducing lens 12 onto a semiconductor wafer 2 supported in place on a susceptor (not shown) and bearing a photoresist film made of an ultraviolet ray sensitive resin and formed on the upper surface of the semiconductor wafer 2, whereby to print on the semiconductor wafer 2 a circuit pattern image corresponding to the photomask 11 but reduced in size with a reduction ratio of 1/10–1/5. Designated at numeral 4 is a shutter, whereas numeral 9 indicates a filter.

Figure 2:
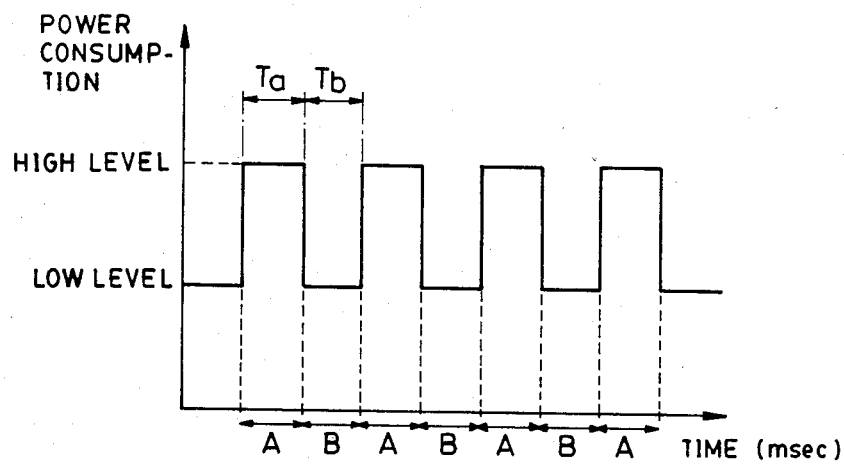
FIG. 2 is a graphic representation showing one example of the waveform of power consumption of a mercury-vapor lamp, which waveform varies due to the repetition of a high-level step and a low-level step.

In the present invention, a semiconductor wafer is exposed in the following manner. In the system shown in FIG. 1, electric power is continuously fed to a mercury-vapor lamp 1 built in a light-focusing mirror 5 so that the mercury-vapor lamp 1 is lit continuously. While maintaining the above lighting state, the electric power to be fed to the mercury-vapor lamp 1 is then controlled by an operation control circuit 3 so that the electric power takes the basic waveform illustrated by way of example in FIG. 2. Accordingly, the power consumption level of the mercury-vapor lamp 1 is alternated periodically and repeatedly between a high level, namely, Step A during which the power consumption of the mercury-vapor lamp 1 is of such a level as about 1.3–2.5 times the rated power consumption of the mercury-vapor lamp 1 and a low level, namely, Step B during which the power consumption of the mercury-vapor lamp 1 is of a level equal or close to its rated power consumption. In Step A of the high power consumption level, a shutter 4 is opened and then closed so as to cause the light radiated from the mercury-vapor lamp 1 to expose a small section of a semiconductor wafer 2 through a photomask 11 for a constant time period, which small section is placed at an exposing position.

The extent of exposure may be controlled to a prescribed desired level on the exposed surface of the semiconductor wafer 2 by setting the opening time of the shutter 4 suitably. In other words, the extent of exposure may be controlled by holding the shutter 4 in its opened position while the mercury-vapor lamp 1 is lit in Step A in which the power consumption of the mercury-vapor lamp 1 is at the high level. Then, after closing the shutter 4, the mercury-vapor lamp 1 is lit in Step B in which its power consumption is at the low level. During Step B, the shutter is kept closed.

Figure 3:
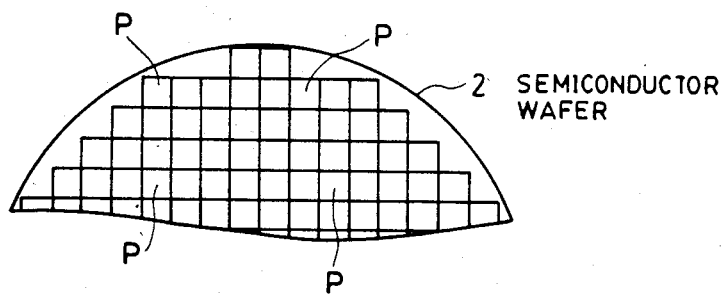
FIG. 3 is a fragmentary plan view of a semiconductor wafer, illustrating some of sections to be exposed.

The repeated alternation of Step A of the high level and Step B of the low level is carried out in synchronization of the manner of the stepwise shifting of the semiconductor wafer 2. Namely, as shown in FIG. 3, the semiconductor wafer 2 is supposed to be divided into a number of minute sections P arranged in rows and columns. These minute sections P are then shifted stepwise one after another successively to the exposure position in the exposure system, where they are exposed one after another successively while held briefly in standstill there. One exposure operation is completed after the opening and closing action of the shutter 4 during the mercury-vapor lamp 1 is lit in Step A, thereby printing a pattern image on one of the minute sections P of the semiconductor wafer 2. The wafer 2 is shifted stepwise while the shutter 4 is closed, so that another minute section P, which is to be exposed next, reaches the exposure position. Exposure is then repeated in the same manner so as to complete the exposure of all minute sections P arranged on the semiconductor wafer.

In the above manner, the mercury-vapor lamp 1 is lit while continuously and repeatedly alternating Step A of the high power consumption level and Step B of the low power consumption level. The opening and closing operation of the shutter 4 and the stepwise shifting position of the semiconductor wafer 2 are controlled in association with Step A and Step B. The time period Ta of each Step A of the high power consumption level may be set constant for example within the range of from 100 msec. to 1000 msec., whereas the time periods Tb of Steps B of the low power consumption level may be the same or different and may range for example from 100 msec. to 1000 msec. At the same time, the switch-over from Step A of the high power consumption level to Step B of the low power consumption level is effected, as depicted in FIG. 4, while controlling the magnitudes of the overshoot $I_1$ and undershoot $I_2$ of the mercury-vapor lamp 1 below 10%. Or in other words, effecting the alternation of the high-level step and low-level step while limiting the magnitude of each of the overshoot and under-shoot to below 10% of the difference between the discharge current in the high-level step and the discharge current in the low-level step. Here, the term "the magnitude of the overshoot $I_1$" means the ratio of the height $h_1$, which protrudes upwardly from the steady high level $i_1$, to the height H from the low level to the high level in the rising time from the low level of the discharge current to its high level in FIG. 4. On the other hand, by the term "the magnitude of the undershoot $I_2$" is meant the ratio of the height $h_2$, which protrudes downwardly from the steady low level $i_2$, to the height H from the low level to the high level. The means for controlling the magnitudes of the overshoot $I_1$ and undershoot $I_2$ of the waveform of the discharge current below 10% is not necessarily limited to any particular means. A known structure of power source circuit may be employed. If the magnitudes of the overshoot $I_1$ and undershoot $I_2$ should exceed 10%, the electrodes of the mercury-vapor lamp will undergo severe wearing, thereby considerably reducing the practically-applicable service life of the mercury-vapor lamp.

In the above method, it is preferred to repeat Step A of the high energy consumption level while increasing the power consumption little by little along the passage of time so that the time-dependent gradual reduction of the quantity of light to be radiated in Steps A can be compensated.

Figure 5:
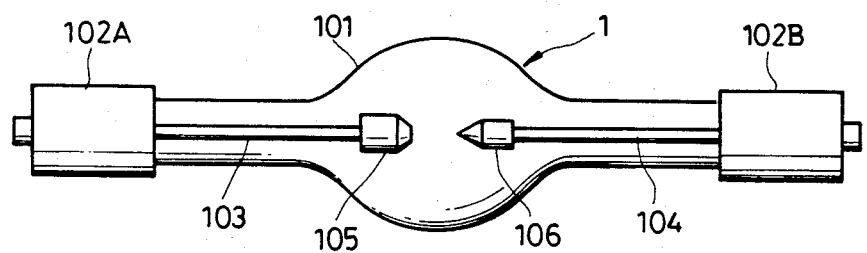
FIG. 5 is a schematic illustration of one example of mercury-vapor lamps.
Figure 6:
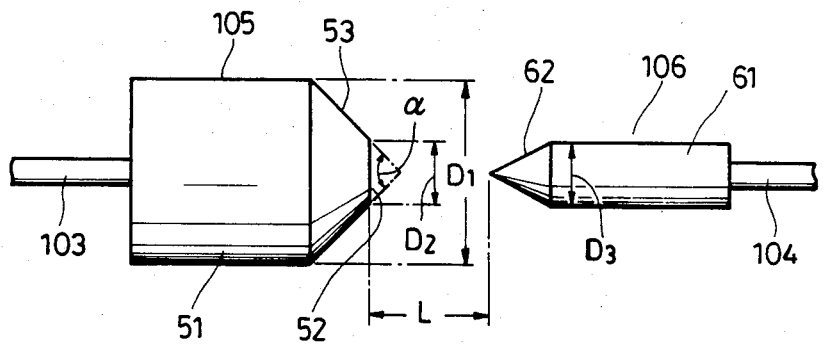
FIG. 6 is an enlarged fragmentary schematic illustration of the mercury-vapor lamp depicted in FIG. 5.

FIG. 5 is a schematic illustration showing one example of a short-arc mercury-vapor lamp 1 to be assembled as an exposing light source in an exposure system useful in the practice of one embodiment of this invention. In FIG. 5, numeral 101 indicates an envelope made of silica glass, which is equipped at both end portions thereof with bases 102A, 102B respectively. Designated at numeral 103, 104 are respectively an anode-supporting stem and cathode-supporting stem. An anode 105 is mounted on the tip of the anode-supporting stem 103, whereas a cathode 106 is fixedly attached to the tip of the cathode-supporting stem 104. These anode 105 and cathode 106 are disposed in a face-to-face relation, centrally, in the interior of the envelope 101. As illustrated on the enlarged scale in FIG. 6, the anode 105 is formed of a base portion 51 having a large diametered column-like shape and a truncated conical tip portion of frusto-conical tip portion 53 extending frontwardly and inwardly from the base portion 51 and terminating in a planar tip surface 52. The cathode 106 is formed of a base portion 61 and a cone-like tip portion 62.

An illustrative specification of such a short-arc mercury-vapor lamp 1 is as follow:

| Specification: | |
|---|---|
| Rated power consumption | 500 W |
| | (50 V, 10 A) |
| Anode 105: | |
| Outer diameter $D_1$ of the base portion 51 | 4.0 mm |
| Diameter $D_2$ of the tip surface 52 | 2.0 mm |
| Opening angle $\alpha$ of the tip portion 53 | 90 degree |
| Cathode 106: | |
| Outer diameter $D_3$ of the base portion 61 | 2.0 mm |
| Interelectrode distance | 3.0 mm |
| Pressure in the envelope while the lamp is turned on. | about 13 atms. |

Using a semiconductor wafer exposure system equipped with a mercury-vapor lamp of the above structure built in as an exposing light source, pattern exposure was conducted on a silicon semiconductor wafer in accordance with the stepwise exposure method while controlling the lighting of the mercury-vapor lamp under the following conditions.

Step A

Time interval Ta: 400 msec.
Power consumption: Maintained constant at 750 W from the beginning until an elapsed time of 300 hours, and then gradually increased to a final power consumption of 1 KW after the elapsed time of 300 hours until an elapsed time of 600 hours.

Step B

Time interval Tb: 400 msec.
Power consumption: Maintained constant at 500 W.
The magnitudes of the overshoot $I_1$ and undershoot $I_2$ in the waveform of the discharge current: 5%

Under the above conditions, it was possible to achieve the same exposure results as the initial exposure results even after an elapsed time of 600 hours.

Further exposure tests were also carried out under the same conditions as the above test except that the magnitudes of the overshoot $I_1$ and undershoot $I_2$ in the waveform of the discharge current were changed to various values given in Table 1. When the overshoot $I_1$ and undershoot $I_2$ exceeded 10%, the practically-applicable service life of mercury-vapor lamps became considerably shorter as indicated also in Table 1.

TABLE 1

| The magnitudes of overshoot $I_1$ and undershoot $I_2$ (%) | Practically-applicable service life of vapor lamp (hours) |
|---|---|
| 6 | 600 |

TABLE 1-continued

| The magnitudes of overshoot $I_1$ and undershoot $I_2$ (%) | Practically-applicable service life of vapor lamp (hours) |
| --- | --- |
| 8 | 600 |
| 12 | 500 |
| 15 | 500 |
| 20 | 300 |
| 25 | 300 |

The method of this invention can bring about the following advantageous effects:

(1) The mercury-vapor lamp is lit at a low power consumption level while the light radiated from the mercury-vapor lamp is not used for exposure. It is thus possible to reduce, to a significant extent, the electricity to be wasted by the mercury-vapor lamp and at the same time, to avoid possible damages to the shutter due to its overheating. In a preferred embodiment, the mercury-vapor lamp may be lit at its rated power consumption level in the steps of the low power consumption level and its power consumption is increased in the steps of the high power consumption level. Thus, the degree of exposure can be adjusted as needed or desired. Accordingly, the exposure of semiconductor wafers can be suitably carried out with a small mercury-vapor lamp. As a result, the exposure system does not, require too much space for its installation, thereby making it possible to lower the cost required for the maintenance of a clean room or the like in which the exposure system is installed and consequently to lower the fabrication cost of semiconductor devices significantly.

(2) Since the alternation of the step of high power consumption level and the step of low power consumption level is effected while controlling the magnitudes of the overshoot and undershoot in the waveform of the discharge current for the mercury-vapor lamp below 10%, the electrodes do not develop early-stage wearing which will occur when the overshoot and undershoot should exceed 10%. It is thus possible to maintain, over a long period of time, the quantity of light to be radiated from the mercury-vapor lamp in the steps of the high power consumption level at the same level as that at the beginning. Furthermore, the service life of the mercury-vapor lamp can be prolonged. As a result, it is possible to perform successive low-cost exposure of semiconductor wafers with a radiated light of stable quantity over a long period of time by repeatedly alternating the step of the high power consumption level and the step of the low power consumption level at a short time interval.

A method according to another embodiment of this invention will next be described. In this method, the switch-over of the mercury-vapor lamp from Step B of the low energy consumption level to Step A of the high energy consumption level is carried out while allowing the power consumption of the mercury-vapor lamp 1 to reach 95% of the power consumption $W_1$ in Step A of the high power consumption level within the period of from 1 msec. to 30 msec. as shown on an enlarged scale in FIG. 7. More specifically, this may be achieved by employing in the operation control circuit 3 a conventionally-known power source circuit that the time required for the power consumption level of the mercury-vapor lamp 1 to reach 95% of its high level when the power consumption rises from its low level to the high level (rise time: T) falls within the range of from 1 msec. to 30 msec. It should however be borne in mind that the overshoot and undershoot are both omitted in FIG. 7.

If the rise time T should exceed 30 msec., the switch-over of the mercury-vapor lamp 1 from Step B of the low power consumption level to Step A of the high power consumption level will not be able to follow the high-speed opening and closing operation of the shutter 4. Thus, such a slow rise time T will impair the high-speed exposure treatment. If the rise time T should be faster than 1 msec. on the other hand, the change of the power consumption will be unduly fast and the wearing of the electrodes of the mercury-vapor lamp 1 will become severe, leading to a reduction to the service life of the mercury-vapor lamp.

Using a semiconductor wafer exposure system similar to that employed in the preceding example, pattern exposure was conducted on a silicon semiconductor wafer in accordance with the stepwise exposure method while controlling the lighting of the mercury-vapor lamp under the following conditions.

Step A

Time interval Ta: 400 msec.
Power consumption: Maintained constant at 750 W from the beginning until an elapsed time of 300 hours, and then gradually increased to a final power consumption of 1 KW after the elapsed time of 300 hours until an elapsed time of 600 hours.

Step B

Time interval Tb: 400 msec.
Power consumption: Maintained constant at 500 W.
The rise time T upon change-over: 20 msec. from Step B to Step A.

Under the above conditions, it was possible to achieve the same exposure results as the initial exposure results even after an elapsed time of 600 hours. By the way, the magnitudes of the overshoot and undershoot in the waveform of the discharge current were 12%.

Still further exposure tests were also carried out under the same conditions as the above test except that the rise time T upon change-over from Step B to Step A was changed to various values shown in Table 2. When the rise time T was shorter than 1 msec., the practically-applicable service life of mercury-vapor lamps were extremely short. When the rise time T was in excess of 30 msec., it was necessary to close the shutter longer and the efficiency of the exposure treatment dropped significantly.

TABLE 2

| The rise time upon switch-over from Step A to Step A (msec.) | Practically-applicable service life of mercury-vapor lamp (hours) |
| --- | --- |
| 0.5 | 400 |
| 3 | 500 |
| 15 | 550 |
| 25 | 600 |
| 40 | 700 |
| 50 | 750 |

Since the switch-over from the step of the low power consumption level to the step of the high power consumption level is carried out while allowing the power consumption of the mercury-vapor lamp to reach 95% of the power consumption in the step of the high power consumption level within the period of from 1 msec. to 30 msec. as described above, it is possible to avoid the early-stage wearing of the electrodes of the mercury-vapor lamp. In addition, the alteration of the step of the low power consumption level and the step of the high power consumption level is carried out at a short time interval. Therefore, it is possible to conduct highly-efficient successive exposure of semiconductor wafers with radiated light of a stable quantity over a long period of time.

It is also possible to prolong the service life of the mercury-vapor lamp still longer by controlling the magnitudes of the overshoot and undershoot in the waveform of the discharge current below 10% and also controlling the rise time T upon change-over from the step of the low power consumption level to the step of the high power consumption level within the period of from 1 msec. to .30 msec.

Having now fully described the invention, it will be apparent to one of ordinary skill in the art that many changes and modifications can be made thereto without departing from the spirit or scope of the invention as set forth herein.

1. In a method for exposing, through a pattern mask, small sections of a semiconductor wafer successively to light radiated from a mercury-vapor lamp in highlevel steps, during each of which the power consumption and discharge current of the mercury-vapor lamp are at a high level, by continuously lighting the mercury-vapor lamp and repeatedly alternating each of the high-level steps and a low-level step during which the power consumption and discharge current of the mercury-vapor lamp are at a low level, wherein the discharge current of the mercury-vapor lamp overshoots the discharge current of the high-level step when the mercury-vapor lamp is switched from the low-level step to the high-level step and undershoots the discharge current of the low-level step when the mercury-vapor lamp is switched from the high-level step to the low-level step, the improvement comprising effecting the alternation of the high-level step and low-level step while limiting the magnitude of each of the overshoot and undershoot to below 10% of the difference between the discharge current in the high-level step and the discharge current in the low-level step.

2. A method as claimed in claim 1, wherein a shutter is opened and then closed only once during the period of each of the high-level steps so as to expose the corresponding one of the small sections of the semiconductor wafer at an exposure position and while the shutter is closed, the semiconductor wafer is shifted stepwise to place the next small section at the exposure position.

3. A method as claimed in claim 1, wherein the level of the power consumption in each of the low-level steps is substantially equal to the rated power consumption of the mercury-vapor lamp and the level of the power consumption in each of the high-level steps is within the range of from 1.3 to 2.5 times the rated power consumption of the mercury-vapor lamp.

4. A method as claimed in claim 1, wherein the the high-level steps are repeated while increasing the power consumption little by little so as to compensate the reduction of the quantity to be radiated along the passage of time.

5. In a method for exposing, through a pattern mask, small sections of a semiconductor wafer successively to light radiated from a mercury-vapor lamp in high-level steps, during each of which the power consumption of the mercury-vapor lamp is at a high level, by continuously lighting the mercury-vapor lamp and repeatedly alternating each of the high-level steps and a low-level step during which the power consumption of the mercury-vapor lamp is at a low level, the improvement comprising the switch-over from each low-level step to its subsequent high-level step being carried out in such a way that the power consumption of the mercury-vapor lamp reaches 95% of the power consumption in the high-level step within a period ranging from 1 msec. to 30 msec.

6. In a method for exposing, through a pattern mask, small sections of a semiconductor wafer successively to light radiated from a mercury-vapor lamp in high-level steps, during each of which the power consumption and discharge current of the mercury-vapor lamp are at a high level, by continuously lighting the mercury-vapor lamp and repeatedly alternating each of the high-level steps and a low-level step during which the power consumption and discharge current of the mercury-vapor lamp are at a low level, wherein the discharge current of the mercury-vapor lamp over-shoots the discharge current of the high-level step when the mercury-vapor lamp is switched from the low-level step to the high-level step and undershoots the discharge current of the low-level step when the mercury-vapor lamp is switched from the high-level step to the low-level step, the improvement comprising effecting the alternation of the high-level step and low-level step while limiting the magnitude of each of the overshoot and undershoot to below 10% of the difference between the discharge current in the high-level step and the discharge current in the low-level step, and the switch-over from each low-level step to its subsequent high-level step is carried out in such a way that the power consumption of the mercury-vapor lamp reaches 95% of the power consumption in the high-level step within a period ranging from 1 msec. to 30 msec.

* * * * *